(12) United States Patent
Chang

(10) Patent No.: US 7,606,037 B2
(45) Date of Patent: Oct. 20, 2009

(54) FASTENER AND HEAT-DISSIPATING DEVICE HAVING THE FASTENER

(75) Inventor: Chun Chang, Taipei Hsien (TW)

(73) Assignee: Aopen Inc., Taipei Hsien (TW)

( * ) Notice: Subject to any disclaimer, the term of this patent is extended or adjusted under 35 U.S.C. 154(b) by 218 days.

(21) Appl. No.: 11/900,520

(22) Filed: Sep. 11, 2007

(65) Prior Publication Data

US 2009/0009963 A1 Jan. 8, 2009

(30) Foreign Application Priority Data

Jul. 3, 2007 (TW) ............................. 96124102 A

(51) Int. Cl.
*H05K 7/20* (2006.01)
*F28F 7/00* (2006.01)

(52) U.S. Cl. .................. 361/719; 361/679.54; 361/704; 361/709; 165/80.3; 24/458; 24/459; 248/510

(58) Field of Classification Search ............ 361/679.46, 361/679.54, 697, 702, 709–710, 719; 165/80.3, 165/185; 174/16.3; 24/297, 453, 455, 457–459, 24/625; 248/505, 510; 403/326, 329, 397
See application file for complete search history.

(56) References Cited

U.S. PATENT DOCUMENTS 6,611,999 B1 * 9/2003 Hsu ............................. 24/457
6,731,504 B1 * 5/2004 Liu ............................. 361/704
7,013,537 B2 * 3/2006 Lin et al. ...................... 24/457
7,333,333 B2 * 2/2008 Zhao et al. ................. 361/700
7,430,121 B2 * 9/2008 Lu et al. ..................... 361/719
2004/0179340 A1 * 9/2004 Lin ............................ 361/704

FOREIGN PATENT DOCUMENTS

TW M287962 2/2006

* cited by examiner

*Primary Examiner*—Jayprakash N Gandhi
*Assistant Examiner*—Robert Hoffberg
(74) *Attorney, Agent, or Firm*—David N. Lathrop

(57) ABSTRACT

A fastener for a heat-dissipating device is adapted to secure a heat sink on a securing seat. The fastener includes a fastening arm having a plate body and a coupling member adapted to couple with one positioning member of the securing seat, a fastening member disposed spacedly below the plate body opposite to the coupling member and adapted to couple with another positioning member, and two linkage sets. Each linkage set is disposed between the plate body and the fastening member, and includes first and second resilient connecting elements connected respectively to the plate body and the fastening member. The linkage sets are pivotable toward each other to cause the plate body to displace toward the fastening member such that the linkage sets engage two openings in the securing seat.

20 Claims, 12 Drawing Sheets

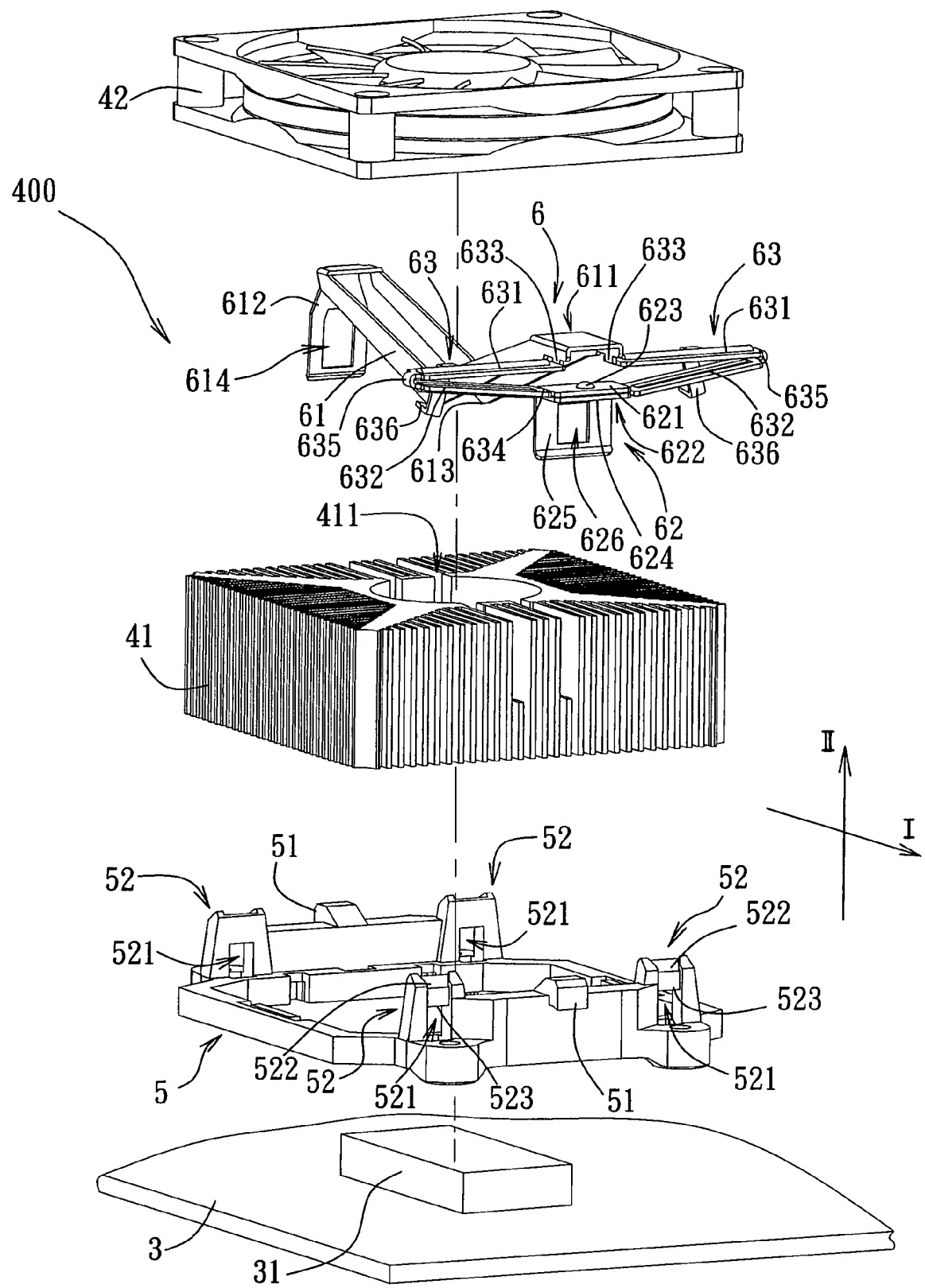
F I G. 8

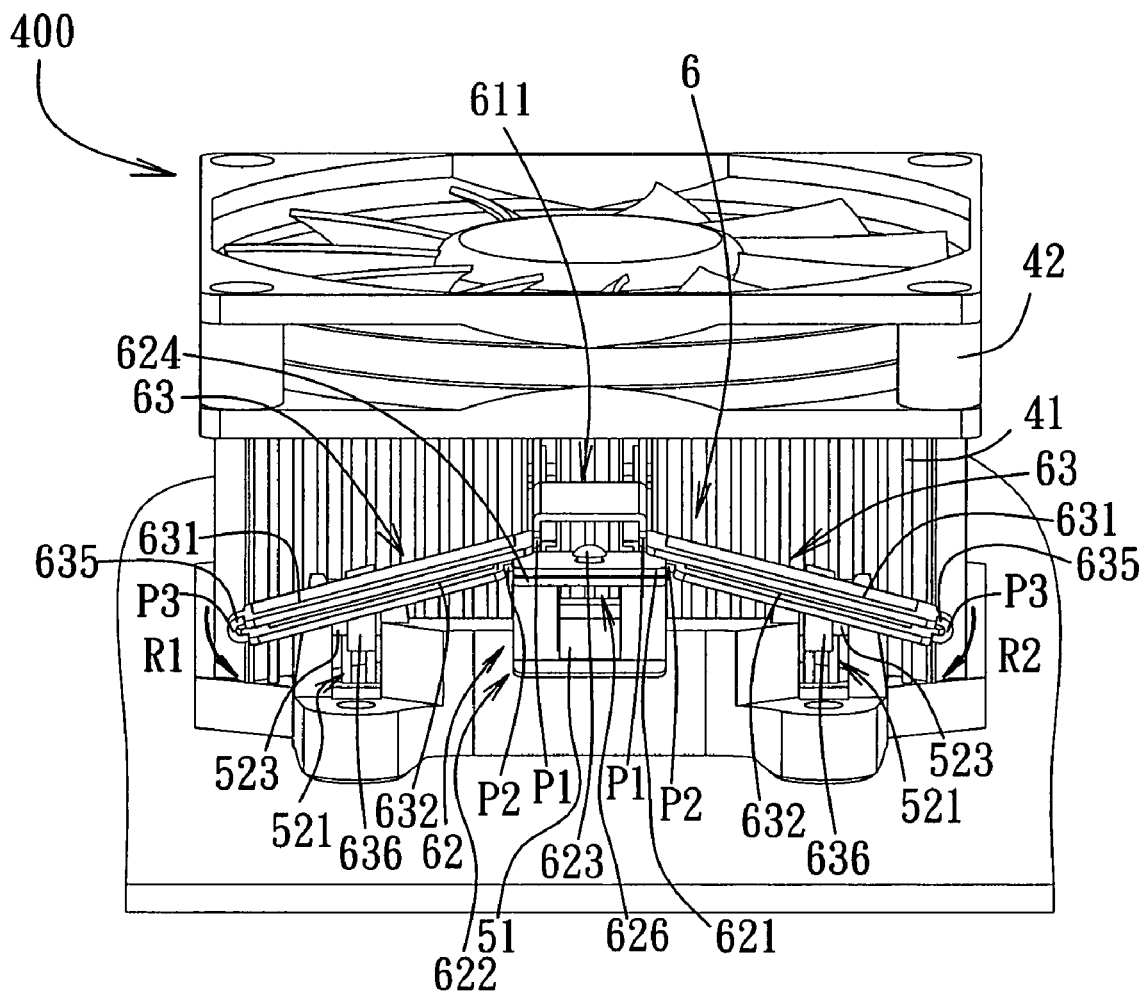
F I G. 12

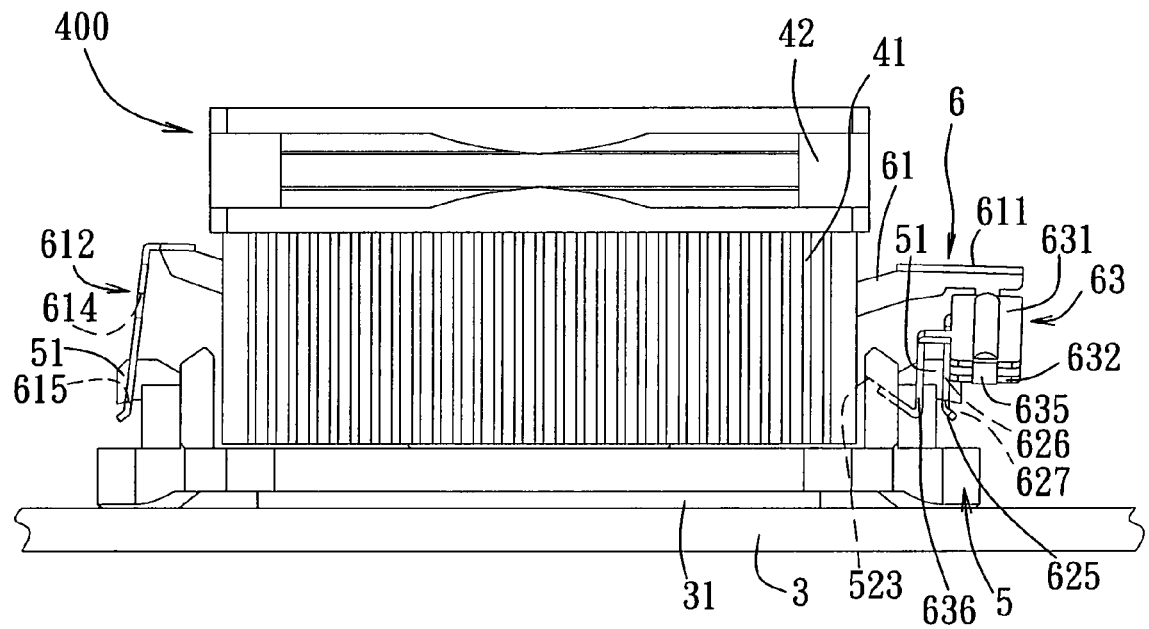
F I G. 13
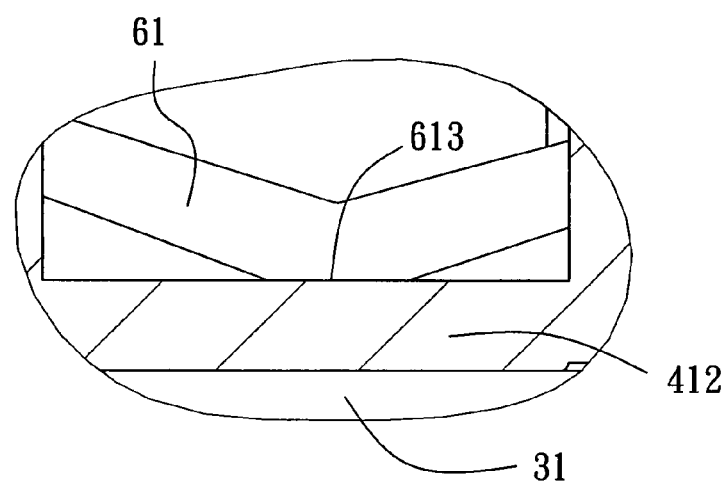
F I G. 14

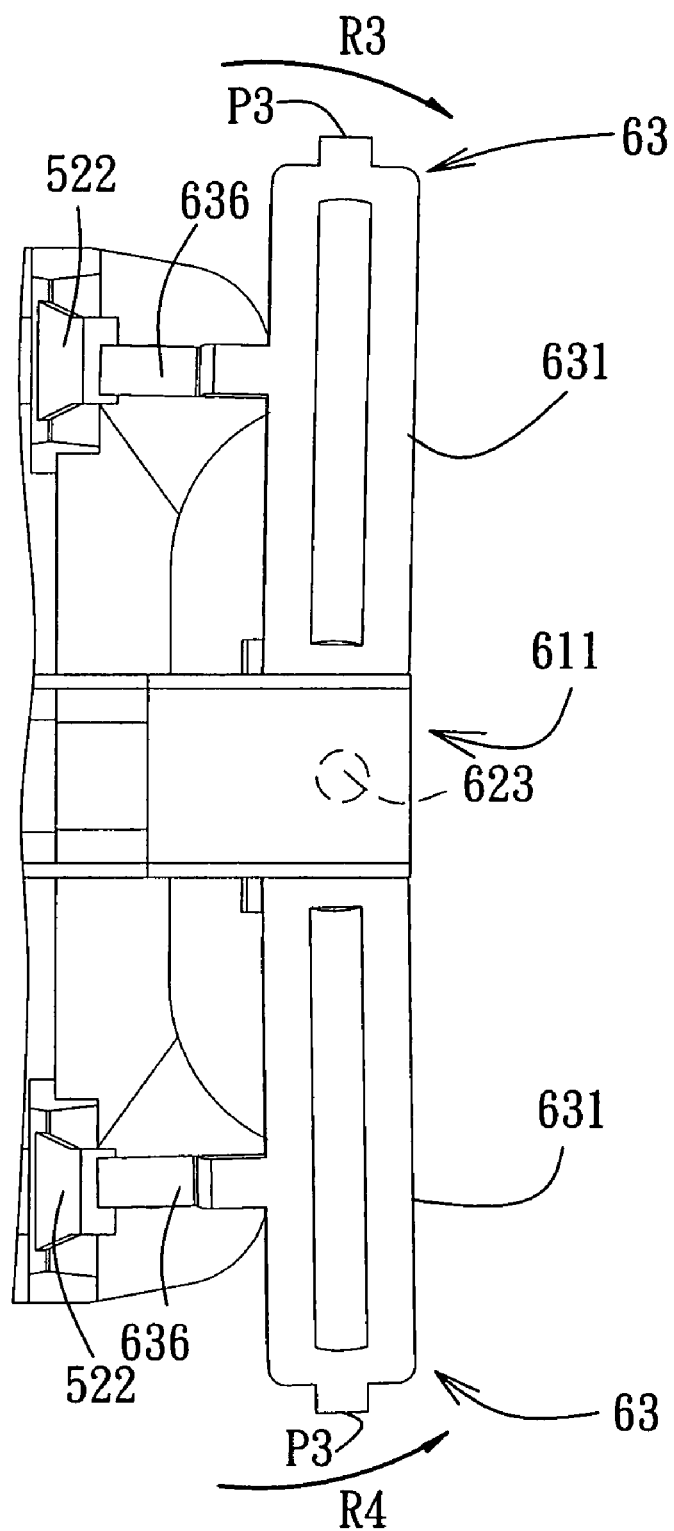
F I G. 16

FASTENER AND HEAT-DISSIPATING DEVICE HAVING THE FASTENER

CROSS-REFERENCE TO RELATED APPLICATION

This application claims priority of Taiwanese Application No. 096124102, filed on Jul. 3, 2007.

BACKGROUND OF THE INVENTION

1. Field of the Invention

The invention relates to a fastener, more particularly to a fastener for a heat-dissipating device.

2. Description of the Related Art

In order to effectively dissipate heat generated by a heat-generating component, such as a central processing unit (CPU) of a computer, generally, a heat sink is caused to abut tightly against a surface of the heat-generating component to help dissipate the heat of the heat-generating component so as to ensure that the heat-generating component can operate under a suitable temperature. In order to enable the heat sink to abut tightly against the surface of the heat-generating component, a securing seat is generally mounted on a circuit board, and a fastener is coupled to the securing seat to apply pressure to the heat sink such that the heat sink abuts tightly against the surface of the heat-generating component.

As shown in FIGS. 1, 2 and 3, a heat sink 10 of a conventional heat-dissipating device is firmly secured on a securing seat 12 by means of two fasteners 11 disposed on two opposite sides of the heat sink 10. Each fastener 11 includes a fastening arm 111 and a fastening member 112 mounted on the fastening arm 111. The fastening arm 111 has an engaging end 113 extending through a securing hole 114 in the fastening member 112. When it is desired to assemble the heat sink 10 to the securing seat 12, an engaging hook 115 of the fastening arm 111 of the fastener 11 is caused to be retained in a positioning hole 121 in the securing seat 12, with the fastening arm 111 abutting against a bottom plate 101 of the heat sink 10. Subsequently, the fastening member 112 is pressed downwardly in a direction indicated by the arrow in FIG. 2 such that an engaging hook 116 at a bottom end thereof is retained in another positioning hole 121 in the securing seat 12, thereby mounting the fastener 11 on the securing seat 12. Thereafter, by repeating the above steps to assemble another fastener 11, two fastening arms 111 of the two fasteners 11 are able to force the heat sink 10 tightly against a surface of a CPU (not shown). However, since such a downward pressing type fastener 11 does not have a force-saving mechanism, the engaging hook 116 of the fastening member 112 cannot be easily retained in the positioning hole 121, due to an insufficiently applied force, an excessively applied force, or an unevenly applied force exerted by the user during assembly. In addition, if it is desired to remove the fastener 11, a greater downward pressing force is required to be exerted for disengaging the engaging hook 116 from the positioning hole 121. Thus, the fastener 11 is not convenient in terms of removal.

There is proposed another type of fastener for a heat-dissipating device which has a force-saving mechanism, such as the rotary type fastener disclosed in R.O.C. Utility Model Patent No. M287962. In said patent, when it is desired to mount a heat sink on a securing seat, a fastening hole in a coupling end portion of a fastening arm and a fastening hole in a fastening plate are caused to respectively engage two retaining blocks disposed on two opposite sides of the securing seat. Thereafter, by manipulating a protruding block on a switch member to cause the latter to rotate, a shaft is released from a position of engagement in two lower positioning grooves, and is guided by guiding oblique faces to displace upwardly. When the shaft engages two upper positioning grooves, the fastening arm of the fastener can urge the heat sink to abut tightly against a surface of a CPU. Although such a rotary type fastener is relatively convenient and force-saving in terms of detachment of the fastener, the components of the fastener are relatively large in number and are complicated in structure, thereby resulting in a relatively high manufacturing cost.

Referring to FIGS. 4, 5 and 6, in a rotary type fastener 21, a fastening member 212 and an operating member 213 are mounted on a fastening arm 211. The fastening member 212 has two plates 215 that are spaced apart from each other and that extend through two through holes 214 in the fastening arm 211. The operating member 213 is pivoted between the two plates 215 by means of a rivet 216. When it is desired to assemble a heat sink 20 to a securing seat 22, a fastening hole 217 in one end of the fastening arm 211 and a fastening hole 218 in a bottom end of one of the plates 215 of the fastening member 212 are caused to respectively engage two retaining blocks 221 disposed on two opposite sides of the securing seat 22, followed by turning of the operating member 213 in a direction indicated by the arrow in FIG. 5. With a curved face 219 of the operating member 213 pushing the fastening arm 211 to displace downwardly and with the operating member 213 bringing the fastening member 212 to displace upwardly, the retaining blocks 221 can firmly engage the fastening holes 217, 218, and the fastening arm 211 can force the heat sink 20 against a surface of a CPU (not shown). Since both the fastening arm 211 and the operating member 213 of the fastener 21 are formed from a metal material, and since the operating member 213 of the fastener 21 will rub against the fastening arm 211 during the turning process, metal shavings (not shown) are generated. If the metal shavings fall onto a circuit board (not shown), short-circuiting or malfunctioning of the circuit board is likely to result.

SUMMARY OF THE INVENTION

Therefore, the main object of the present invention is to provide a fastener for a heat-dissipating device which has relatively few components so as to reduce manufacturing costs, and which is easy to operate, and which can prevent generation of friction among the components of the fastener.

Another object of the present invention is to provide a heat-dissipating device that has relatively few components so as to reduce manufacturing costs, that is easy to operate, and that can prevent generation of friction among fastener components.

Accordingly, a fastener for a heat-dissipating device of the present invention is adapted to secure a heat sink on a securing seat. The securing seat includes two positioning members disposed respectively on two opposite sides of the securing seat, and two openings disposed respectively in two opposite sides of one of the two positioning members. The fastener includes a fastening arm, a fastening member, and two linkage sets.

The fastening arm has a coupling member and a plate body disposed respectively at two opposite ends thereof. The coupling member is adapted to couple with one of the positioning members. The fastening member is disposed spacedly below the plate body of the fastening arm and opposite to the coupling member. The fastening member is adapted to couple with the other of the positioning members. Each of the linkage sets is connected to and is disposed between the plate body and the fastening member. The two linkage sets are disposed respectively on two opposite sides of the plate body and of the fastening member. Each of the linkage sets includes a first resilient connecting element connected to the plate body, and a second resilient connecting element connected to the fastening member. The two linkage sets are pivotable toward each other in a direction of the fastening member within a determined angle, with the first and second resilient connecting elements serving as axes, respectively, and are capable of bringing the plate body to displace downward toward the fastening member such that the two linkage sets are adapted to engage the two openings, respectively.

The present invention is further characterized in that the fastener is formed integrally.

The present invention is further characterized in that each of the linkage sets further includes an engaging hook disposed at one side of the first and second resilient connecting elements for engaging the respective one of the openings.

The present invention is further characterized in that each of the linkage sets further includes a first link having one end connected to the first resilient connecting element, a second link having one end connected to the second resilient connecting element, and a third resilient connecting element connected to the other end of the first link and to the other end of the second link. The first link and the second link form an included angle therebetween. The present invention is further characterized in that the first link has a length longer than that of the second link such that each of the linkage sets are readily depressible and such that the plate body has a longer range of downward travel.

The present invention is further characterized in that the first, second and third resilient connecting elements are bent pieces. The present invention is further characterized in that the fastener defines a first axis and a second axis perpendicular to the first axis. The two linkage sets are pivotable about the first axis toward each other within a determined angle, with the first and second resilient connecting elements serving as axes.

The present invention is further characterized in that the fastening member further includes a first coupling plate connected to the second resilient connecting element of one of the linkage sets, and a second coupling plate connected to the second resilient connecting element of the other one of the linkage sets. The fastening member further includes a pivot element connecting pivotally the first and second coupling plates. The two linkage sets are pivotable about the second axis within a determined angle such that the two linkage sets are respectively separated from the two openings.

The present invention is further characterized in that the second coupling plate has a substantially inverted L-shape, and includes a first plate body, a second plate body formed at one end of the first plate body, and a fastening hole formed in the second plate body and adapted to engage the other of the positioning members of the securing seat. The pivot element connects the first coupling plate and the first plate body of the second coupling plate.

The fastener for a heat-dissipating device according to the present invention is relatively convenient to operate and can achieve a force-saving effect during the process of removal. In addition, the components of the fastener are small in number and are simple in construction, thereby reducing the manufacturing cost. Furthermore, the various components of the fastener will not rub against each other during operation, thereby eliminating the problem associated with metal shavings, that result from frictional rubbing, falling onto a circuit board.

BRIEF DESCRIPTION OF THE DRAWINGS

Other features and advantages of the present invention will become apparent in the following detailed description of the preferred embodiment with reference to the accompanying drawings, of which:

FIG. 8 is an exploded perspective view of the preferred embodiment to illustrate the assembly relationship among a securing seat, a heat sink, a fastener, and a heat-dissipating fan;

FIG. 12 is a front view of the preferred embodiment according to the present invention to illustrate the fastener in a locked state relative to the securing seat;

FIG. 13 is a side view of the preferred embodiment according to the present invention to illustrate the fastener in the locked state relative to the securing seat;

FIG. 14 is an enlarged fragmentary view of the preferred embodiment according to the present invention to illustrate an abutting portion of a fastening arm abutting against a bottom plate of the heat sink;

FIG. 16 is an enlarged fragmentary schematic view similar to FIG. 15, illustrating the engaging hooks of the fastener disengaged from the openings in the securing seat.

DETAILED DESCRIPTION OF THE PREFERRED EMBODIMENT

Figure 1:
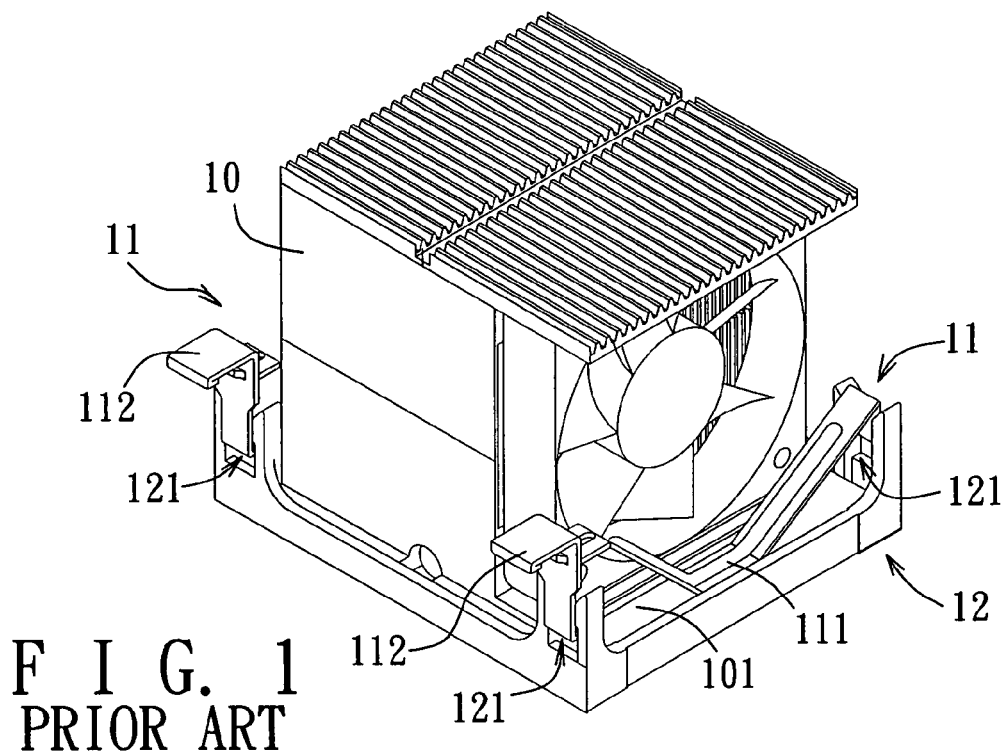
FIG. 1 is a perspective view of a conventional heat-dissipating device.
Figure 2:
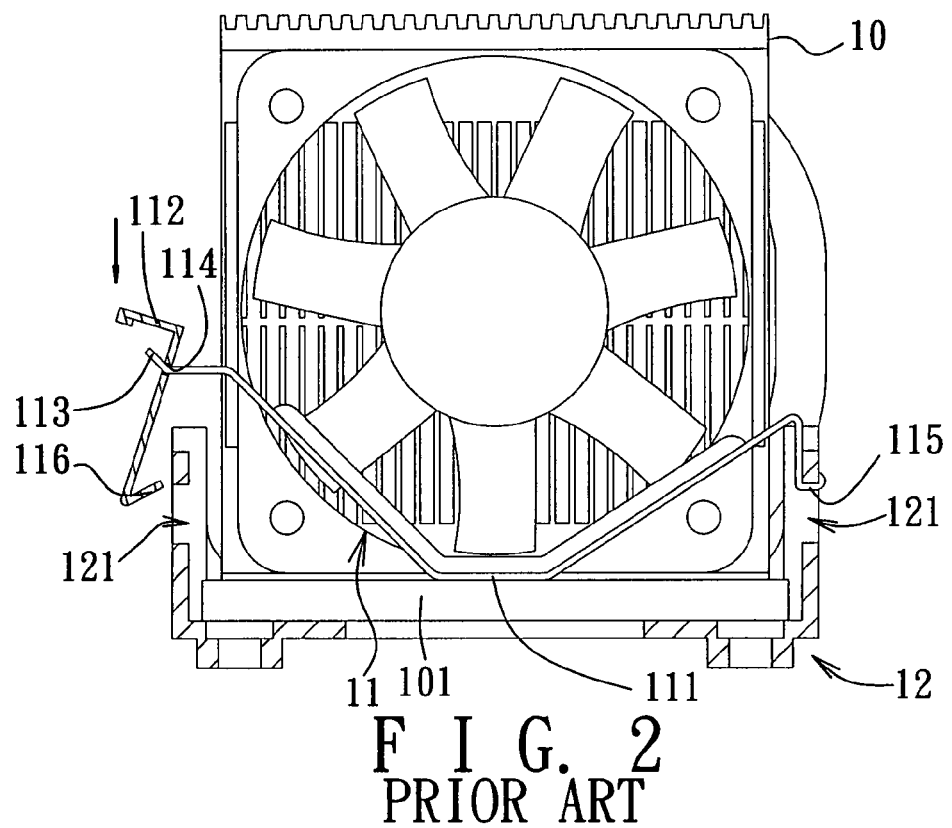
FIG. 2 is a partly sectional schematic side view of the conventional heat-dissipating device of FIG. 1.
Figure 3:
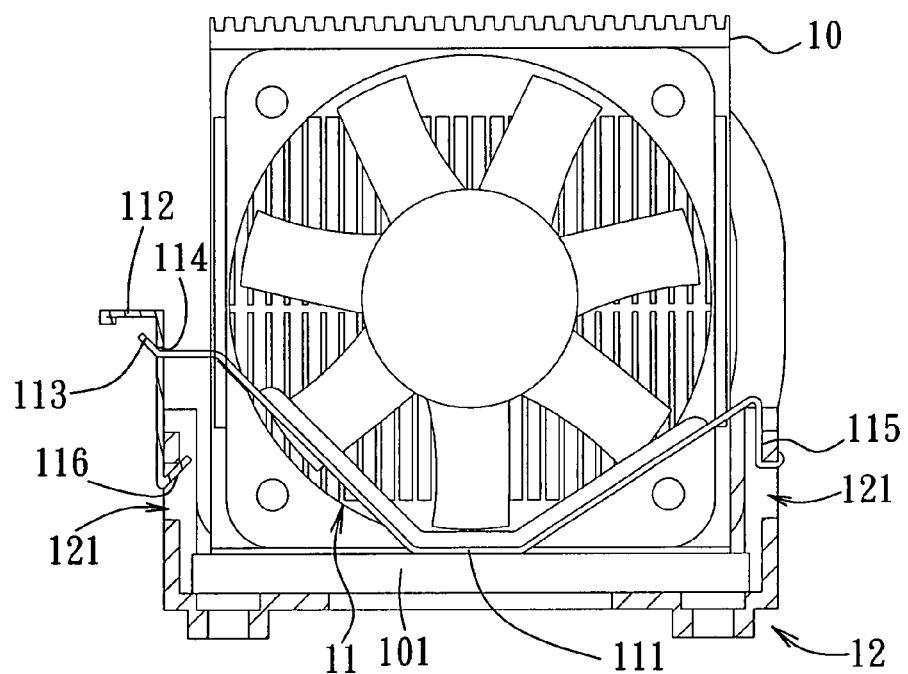
FIG. 3 is another partly sectional schematic side view of the conventional heat-dissipating device of FIG. 1, illustrating engaging hooks of a fastener retained in positioning holes in a securing seat.
Figure 4:
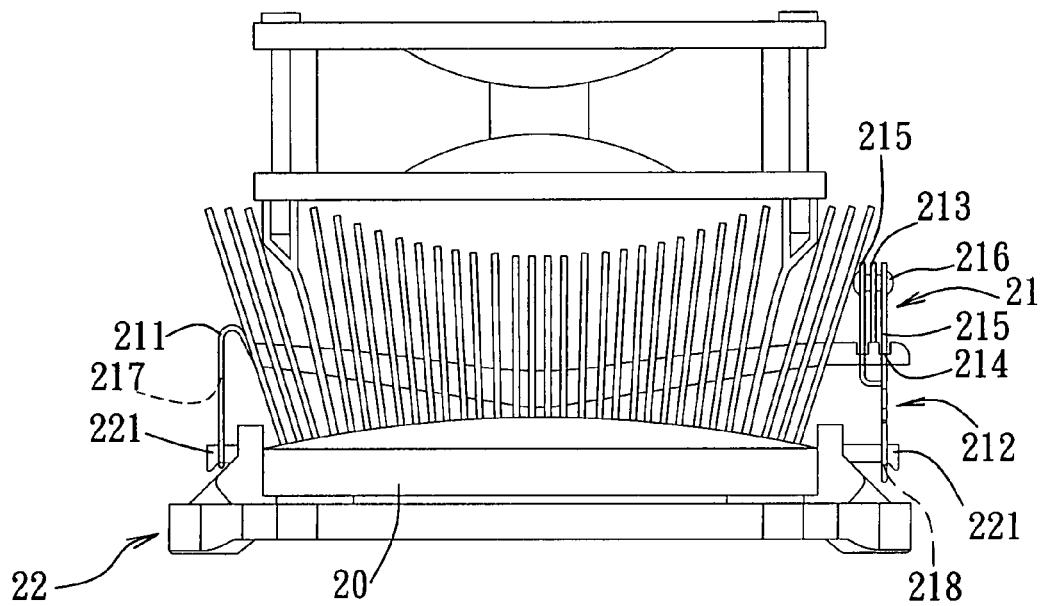
FIG. 4 is a side view to illustrate another conventional heat-dissipating device.
Figure 5:
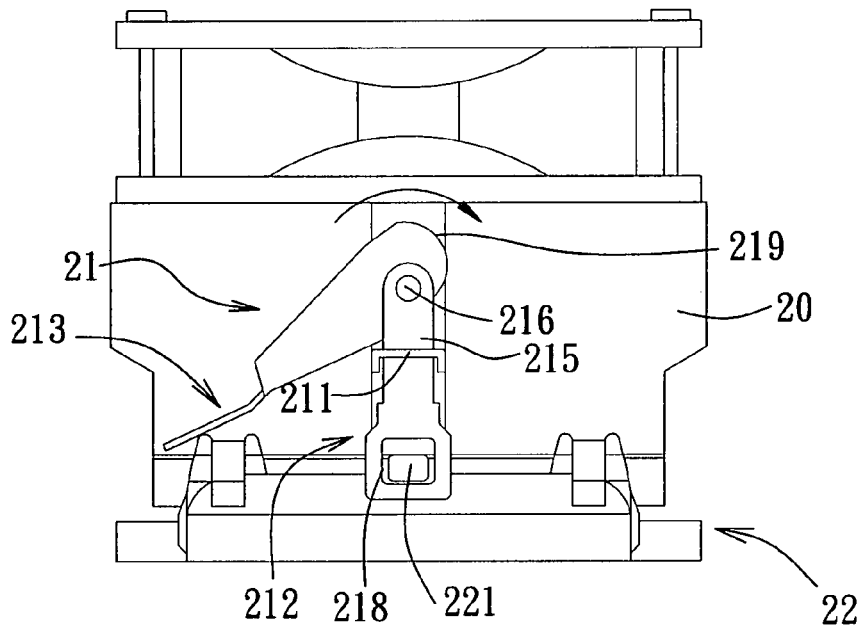
FIG. 5 is a front view of the conventional heat-dissipating device of FIG. 4.
Figure 6:
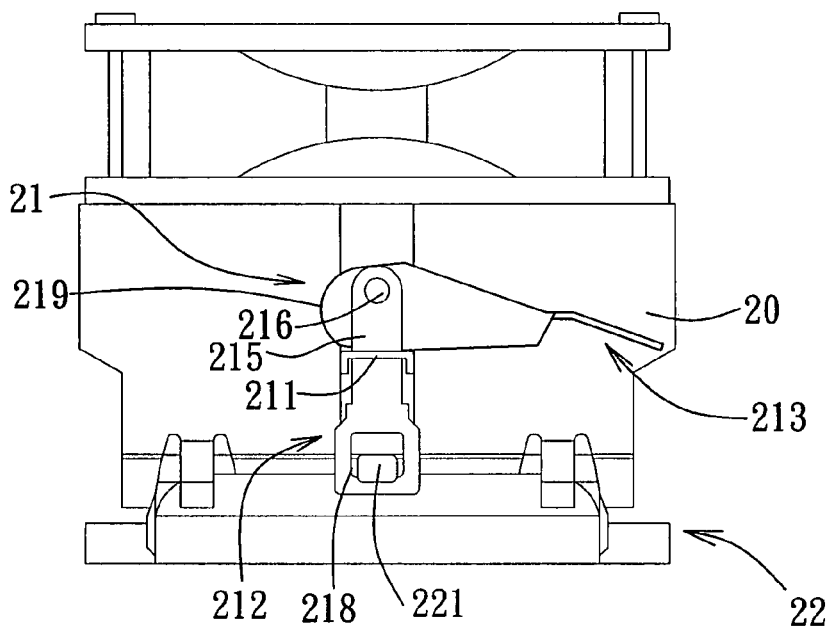
FIG. 6 is a front view of the conventional heat-dissipating device of FIG. 4 to illustrate that a retaining block of a securing seat engages a fastening hole in a fastener.
Figure 7:
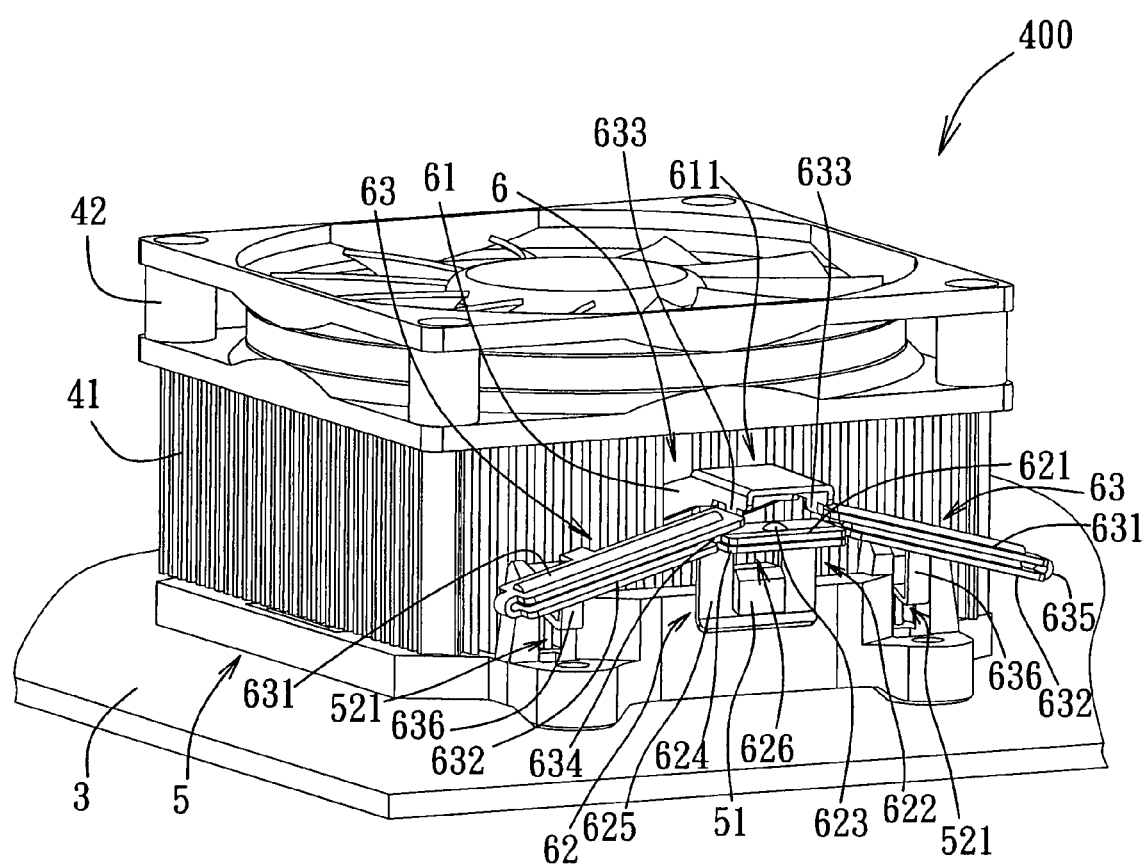
FIG. 7 is a perspective view of a preferred embodiment of a heat-dissipating device according to the present invention.

Referring to FIGS. 7 and 8, the preferred embodiment of a heat-dissipating device 400 according to the present invention is adapted to be applied to a computer, and is primarily used to dissipate heat from an electronic component 31 on a circuit board 3. In this embodiment, the electronic component 31 is a central processing unit (CPU). The heat-dissipating device 400 includes a securing seat 5, a fastener 6 made of metal, a heat sink 41, and a heat-dissipating fan 42. The securing seat 5 and the fastener 6 are used to hold the heat sink 41 tightly against an upper surface of the electronic component 31.

In the following description, the side of the fastener 6 shown in FIG. 7 which is facing the reader is referred to as the front side, and the side opposite to the front side is the rear side. Besides, the side to the left of the fastener 6 is the left side, and the side to the right of the fastener 6 is the right side. It is particularly noted herein that the directional phrases, such as front, rear, left and right sides, as used herein are defined in relation to the drawings, and are intended to facilitate description of the present invention rather than to limit the scope of the present invention.

Figure 9:
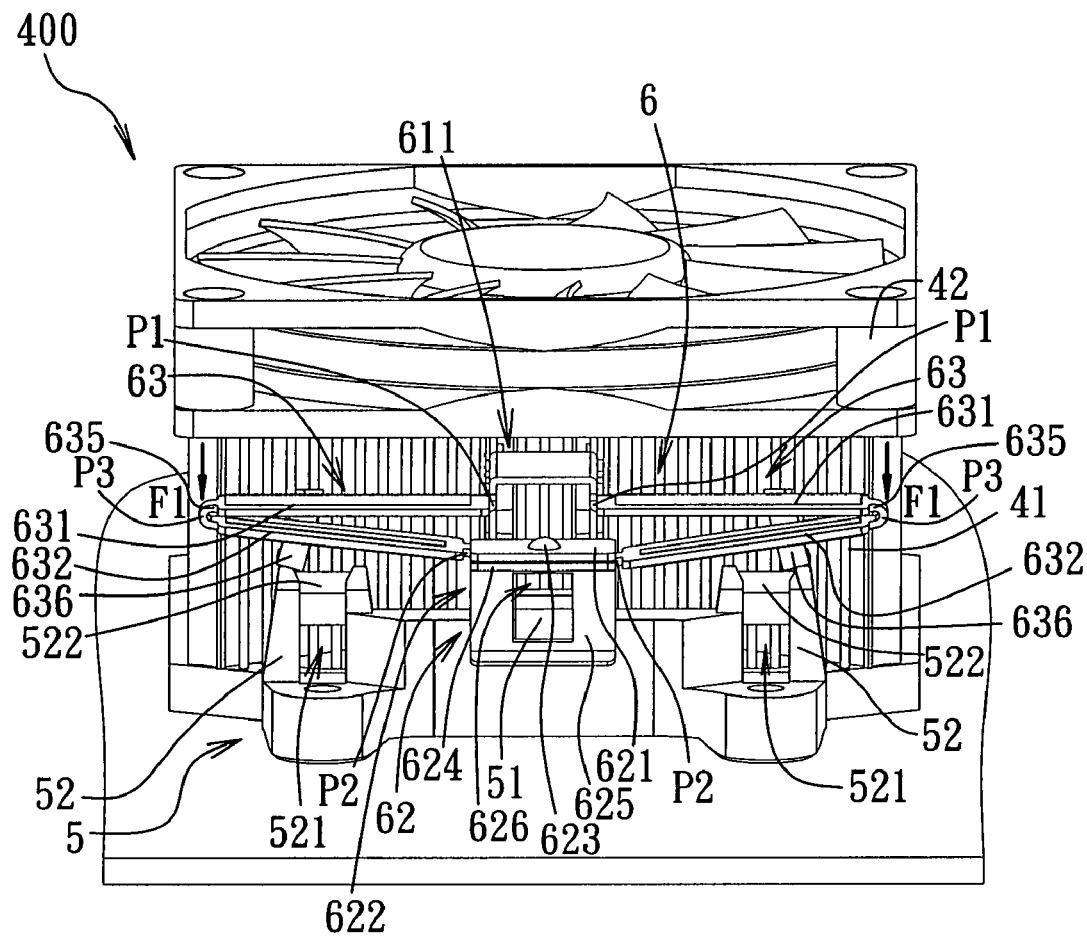
FIG. 9 is a front view of the preferred embodiment to illustrate the fastener in a released state relative to the securing seat.

Referring to FIGS. 7, 8 and 9, the securing seat 5 is in the form of a frame for mounting of the heat sink 41 thereon, and includes two positioning members 51 in the form of protruding blocks and disposed respectively on opposite front and rear sides of the securing seat 5, and four posts 52. The posts 52 in an adjacent pair are respectively disposed on left and right sides of a respective one of the positioning members 51. Each post 52 defines a substantially rectangular opening 521, and has a top end provided with an oblique face 522 that extends slantingly outward and downward.

The fastener 6 defines a first axis (I) extending in a front-to-rear direction, and a second axis (II) extending in a top-to-bottom direction and perpendicular to the first axis (I). The fastener 6 includes a fastening arm 61, a fastening member 62, and two linkage sets 63. The fastening arm 61 is substantially V-shaped, and is disposed to abut against the heat sink 41. The fastening arm 61 has a plate body 611 and a coupling member 612 disposed respectively at front and rear ends thereof, and an abutting portion 613 disposed between the plate body 611 and the coupling member 612. The plate body 611 has a substantially inverted U-shape and opens downwardly. The coupling member 612 is provided with a substantially rectangular fastening hole 614 for engaging one of the positioning members 51 of the securing seat 5. The fastening member 62 is disposed spacedly below the plate body 611 of the fastening arm 61, and has a first coupling plate 621, a second coupling plate 622, and a pivot element 623. The first coupling plate 621 is substantially rectangular, and extends horizontally in a left-to-right direction. The second coupling plate 622 has a substantially inverted L-shape, and includes a first plate body 624 corresponding in shape to the first coupling plate 621, a second plate body 625 extending vertically downward from a rear end of the first plate body 624, and a fastening hole 626 formed in the second plate body 625 for engaging the other of the positioning members 51 of the securing seat 5, the fastening hole 626 having a substantially rectangular shape. The pivot element 623 is a rivet connecting pivotally the first coupling plate 621 and the first plate body 624 of the second coupling plate 622.

Each linkage set 63 has a first link 631 and a second link 632 that are substantially elongated plates, a first resilient connecting element 633, a second. resilient connecting element 634, a third resilient connecting element 635, and an engaging hook 636. A lengthwise direction of extension of the first and second links 631, 632 is substantially perpendicular to the lengthwise direction of extension of the fastening arm 61, and the first and second links 631, 632 form an included angle therebetween. The first link 631 is disposed above the second link 632, and has a length longer than that of the second link 632. The engaging hook 636 of each linkage set 63 is formed on a rear side of the first link 631 for engaging a respective one of the openings 521 in the securing seat 5.

Each linkage set 63 is connected to and is disposed between the plate body 611 and the fastening member 62. Furthermore, the two linkage sets 63 are disposed respectively on opposite left and right sides of the plate body 611 and of the fastening member 62. The first, second and third resilient connecting elements 633, 634, 635 of each linkage set 63 are bent pieces. The first resilient connecting elements 633 of the two linkage sets 63 are respectively connected to bottom ends of left and right sides of the plate body 611, are connected to and disposed between inner side ends of the two first links 631 of the two linkage sets 63, and respectively define two first pivots (P1) (see FIG. 9). The second resilient connecting element 634 of one of the linkage sets 63 on the left side is connected to the second link 632 of the corresponding linkage set 63 and to the first coupling plate 621, and defines a second pivot (P2). The second resilient connecting element 634 of the other one of the linkage sets 63 on the right side is connected to the second link 632 of the corresponding linkage set 63 and to the first plate body 624 of the second coupling plate 622, and defines another second pivot (P2). The third resilient connecting elements 635 of the two linkage sets 63 are respectively connected to outer side ends of the first and second links 631, 632, and respectively define two third pivots (P3).

Figure 10:
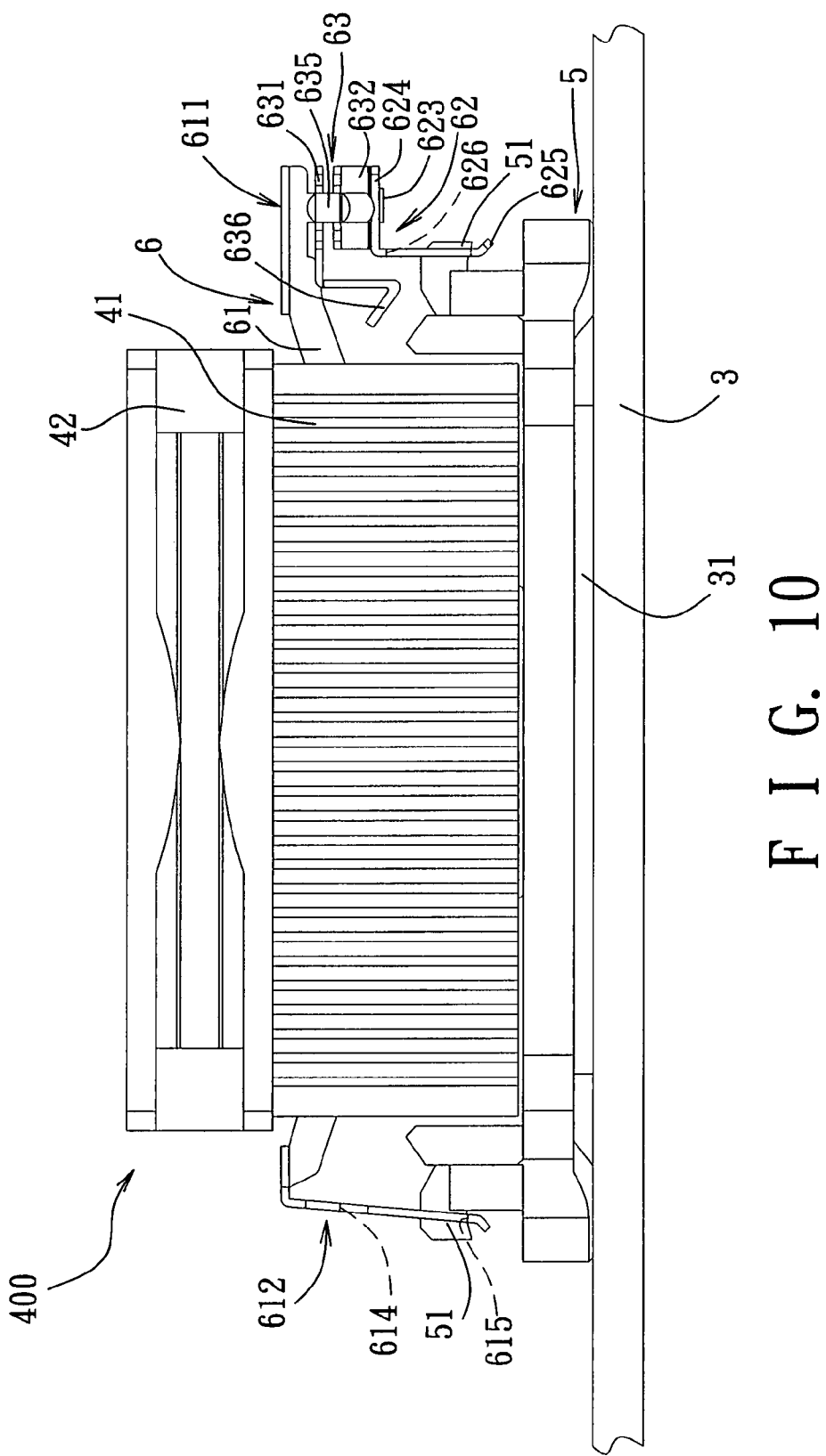
FIG. 10 is a side view of the preferred embodiment to illustrate the fastener in a released state relative to the securing seat.

Due to the configuration of the first, second, and third resilient connecting elements 633, 634, 635, the two linkage sets 63 can pivot toward the fastening member 62 after the two first links 631 are pressed. Moreover, since the lengthwise directions of extension of the first and second links 631, 632 are substantially perpendicular to the lengthwise direction of extension of the fastening arm 61, the two linkage sets 63 are readily brought to pivot after being pressed. As shown in FIGS. 8, 9 and 10, when it is desired to assemble the heat-dissipating device 400, the securing seat 5 is first secured and mounted on the circuit board 3 using screws (not shown), such that the securing seat 5 surrounds the electronic component 31. Subsequently, the heat sink 41 is placed on the securing seat 5, and the fastener 6 is disposed to straddle the heat sink 41 in a receiving recess 411 in the heat sink 41, with the fastening hole 614 in the coupling member 612 and the fastening hole 626 in the fastening member 62 respectively engaging the two positioning members 51 of the securing seat 5. In this state, the heat-dissipating fan 42 can be lockably secured on the heat sink 41 using screws (not shown).

Figure 11:
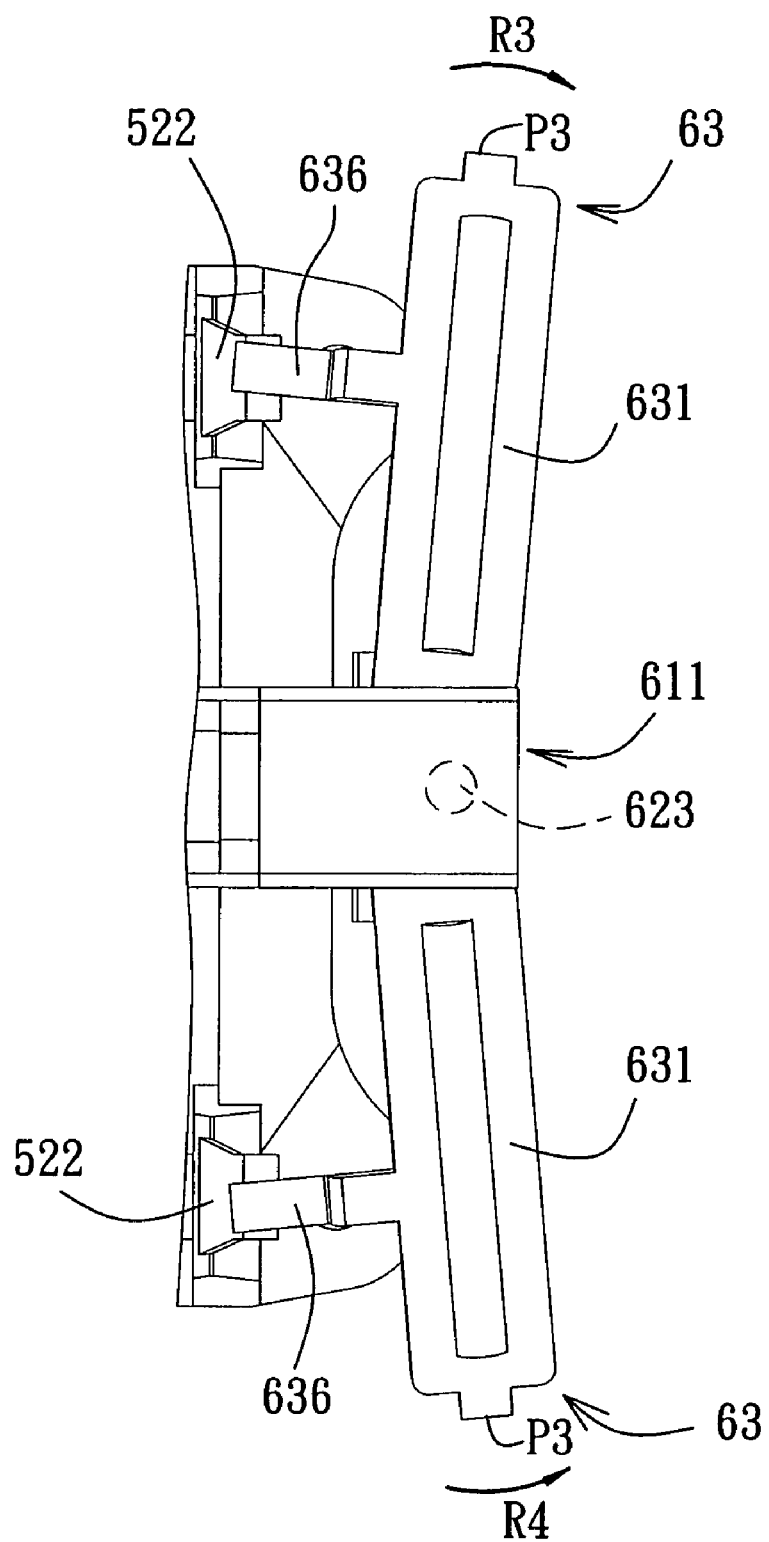
FIG. 11 is an enlarged fragmentary schematic view of the preferred embodiment to illustrate that engaging hooks of the fastener are pushed by oblique faces so as to cause two linkage sets to pivot forward.

Referring to FIGS. 9, 11 and 12, when the user applies a downward pressing force (Fl) to the first link 631 of each of the two linkage sets 63, the first and second links 631, 632 will pivot about the first axis (I) (see FIG. 8) within a determined angle toward the fastening member 62, with the first and second pivots (P1), (P2) as respective axes, i.e., the two linkage sets 63 pivot toward each other in the directions indicated by arrows (R1), (R2) in FIG. 12. It is particularly noted that, if the user exerts the downward pressing force (Fl) on a top side of each of the two first links 631 very close to the respective third resilient connecting element 635, because of a relatively long force arm, relatively small downward pressing forces (Fl) will be sufficient to cause the two linkage sets 63 to pivot. It will require the least force to operate the two linkage sets 63 to pivot downwardly if the downward pressing forces (Fl) are applied to the two third resilient connecting elements 635, as shown in FIG. 9. When the two engaging hooks 636 respectively abut against the two oblique faces 522, the engaging hooks 636 will be respectively pushed by the oblique faces 522 to move forwardly, so that the two linkage sets 63 pivot forward about the second axis (II) (see FIG. 8) within a determined angle in the directions indicated by arrows (R3), (R4) (see FIG. 11), whereupon the first resilient connecting elements 633 (see FIG. 8) of the two linkage sets 63 will be bent further, and the first coupling plate 621 and the first plate body 624 of the second coupling plate 622 rotate about the pivot element 623. When the two engaging hooks 636 move downwardly to where the two corresponding openings 521 are, due to the restoring force of the first resilient connecting elements 633 of the two linkage sets 63, the two engaging hooks 636 can extend rearwardly and respectively into the two corresponding openings 521 to engage slanting top portions 523 (see FIG. 13) of the two corresponding openings 521, respectively. As a result, the fastener 6 will be switched from a released state relative to the securing seat 5 as shown in FIG. 9 to a locked state as shown in FIG. 12. As shown in FIGS. 9, 12, and 13, during pivotal rotation of the two linkage sets 63, the first links 631 will bring the plate body 611 to displace downward toward the fastening member 62, so that a flat bottom portion 615 of the fastening hole 614 in the coupling member 612 engages a bottom side of one of the positioning members 51 of the securing seat 5, whereas the second links 632 will push the fastening member 62 to displace upward, so that a flat bottom portion 627 of the fastening hole 626 in the second plate body 625 engages a bottom side of the other positioning member 51 of the securing seat 5. By means of the two engaging hooks 636 respectively engaging the slanting top portions 523 of two of the openings 521, and by means of the flat bottom portions 615, 627 of the fastening holes 614, 626 respectively engaging the bottom sides of the two positioning members 51, the fastener 6 can secure the heat sink 41 firmly on the securing seat 5. It should be mentioned that, since the first links 631 are designed to be longer than the second links 632, the linkage sets 63 are readily depressible, and the range of downward travel of the plate body 611 can be longer.

Figure 15:
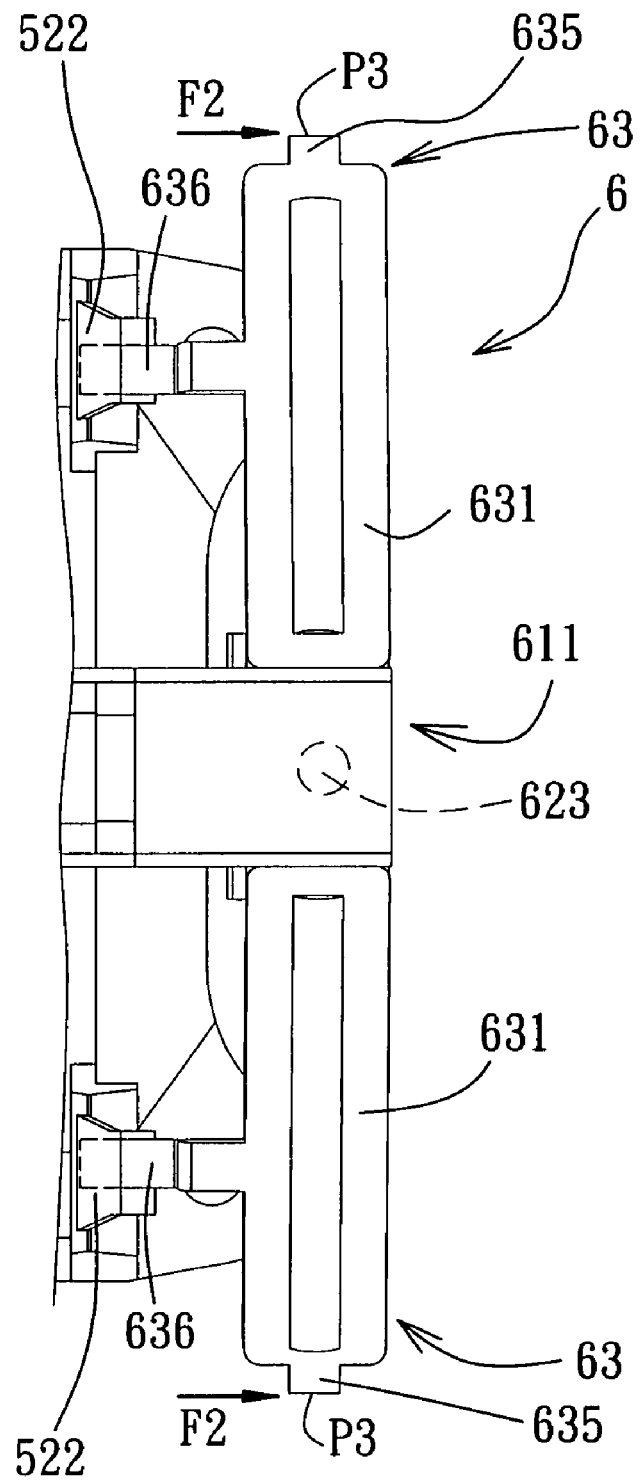
FIG. 15 is an enlarged fragmentary schematic view of the preferred embodiment according to the present invention to illustrate the engaging hooks of the fastener engaging openings in the securing seat.

Referring to FIGS. 13 and 14, since the plate body 611 of the fastening arm 61 will displace downward a certain distance when the fastener 6 is switched from the released state to the locked state, the abutting portion 613 of the fastening arm 61 can abut tightly against a bottom plate 412 of the heat sink 41, so that the bottom plate 412 in turn can abut tightly against the upper surface of the electronic component 31 to ensure that there is not any gap between the bottom plate 412 of the heat sink 41 and the electronic component 31, thereby enhancing the heat-dissipating efficiency. Referring to FIGS. 8, 12, 15, and 16, when it is desired to separate the heat sink 41 and the heat-dissipating fan 42 from the securing seat 5, the user can apply a lateral force (F2) to the rear side of the first link 631 of each of the two linkage sets 63, so that the two linkage sets 63 pivot forwardly about the second axis (II) within a determined angle in the directions indicated by the arrows (R3), (R4), respectively. In this state, the first resilient connecting elements 633 of the two linkage sets 63 will be bent further, and the first coupling plate 621 and the first plate body 624 of the second coupling plate 622 rotate about the pivot element 623. When the two engaging hooks 636arerespectivelydisengaged from the two corresponding openings 521, the two linkage sets 63 of the fastener 6 will be restored to the released state shown in FIG. 9 due to the restoring force of the first, second and third resilient connecting elements 633, 634, 635. Thereafter, by disengaging the fastening holes 614, 626 respectively from the two positioning members 51, the user can separate both the heat sink 41 and the heat-dissipating fan 42 from the securing seat 5. It is particularly noted that, if the user applies the lateral force (F2) to the rear side of the first link 631 of each of the linkage sets 63 very close to the respective third resilient connecting element 635, due to a longer force arm, relatively small lateral forces (F2) will be sufficient to operate the two linkage sets 63 to cause them to pivot. It will require the least force to operate the two linkage sets 63 to pivot forwardly if the lateral forces (F2) are applied to the two third resilient connecting elements 635, as shown in FIG. 15.

Since the two linkage sets 63 can be brought to pivot toward each other when the user applies a downward pressing force (F1) (see FIG. 9) to the third resilient connecting element 635 of each of the two linkage sets 63, the engaging hooks 636 can engage the two corresponding openings 521 upon moving to the corresponding openings 521 due to the restoring force of the first resilient connecting elements 633. When the fastener 6 is switched from the released state shown in FIG. 9 to the locked state shown in FIG. 12, the plate body 611 of the fastening arm 61 will displace downward a certain distance due to the movement of the two linkage sets 63, so that the flat bottom portion 615 of the fastening hole 614 in the coupling member 612 engages the bottom side of the corresponding positioning member 51 of the securing seat 5, and the abutting portion 613 (see FIG. 14) of the fastening arm 61 abuts tightly against the bottom plate 412 of the heat sink 41 to cause the bottom plate 412 to abut tightly against the upper surface of the electronic component 31 (see FIG. 14). By applying a force evenly to the two linkage sets 63, the user can cause the plate body 611 of the fastening arm 61 to displace downwardly, so as to allow the engaging hooks 636 to engage the two corresponding openings 521, respectively, thereby permitting a tight contact between the bottom plate 412 of the heat sink 41 and the electronic component 31. By means of the arrangement of the two linkage sets 63, the fastener 6 can achieve a force-saving effect in operation. Moreover, by applying the lateral force (F2) to each of the third pivots (P3) of the two linkage sets 63, the user can cause the two linkage sets 63 to pivot forwardly, so as to permit disengagement of the two engaging hooks 636 from the two corresponding openings 521. Therefore, the fastener 6 is not only force-saving but is also convenient to operate during the removal process.

On the other hand, the fastening arm 61 of the fastener 6, the first and second coupling plates 621, 622 of the fastening member 62, and the two linkage sets 63 are integrally formed from a metal material by punching and by undergoing a series of bending steps. After the first coupling plate 621 and the first plate body 624 of the second coupling plate 622 are connected pivotally using the pivot element 623, fabrication of the fastener 6 is complete. Since the number of components forming the fastener 6 is small, and the structure of the fastener 6 is simple, a reduction in manufacturing cost is possible. In addition, during removal of the fastener 6, generation of friction among the components of the fastener 6 can be avoided to prevent generation of metal shavings that can fall onto the circuit board 3. To sum up, in the preferred embodiment of the heat-dissipating device 400, due to the configuration of the fastener 6, operation is made relatively convenient and a force-saving effect can be achieved during the process of removal of the heat sink 41 and the securing seat 5. In addition, the components of the fastener 6 are few in number and are simple in structure, and can therefore reduce the manufacturing cost. Furthermore, the components of the fastener 6 will not rub against each other during operation, thereby eliminating the problem associated with generation of metal shavings that can fall onto the circuit board 3. The objects of the present invention are thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A fastener for a heat-dissipating device, said fastener being adapted to secure a heat sink on a securing seat, the securing seat including two positioning members disposed respectively on two opposite sides of the securing seat, and two openings disposed respectively in two opposite sides of one of the two positioning members, said fastener comprising:
   a fastening arm having a coupling member and a plate body disposed respectively at two opposite ends thereof, said coupling member being adapted to couple with one of the positioning members;
   a fastening member disposed spacedly below said plate body of said fastening arm and opposite to said coupling member, said fastening member being adapted to couple with the other of the positioning members; and
   two linkage sets, each of which is connected to and is disposed between said plate body and said fastening member, said two linkage sets being disposed respectively on two opposite sides of said plate body and of said fastening member, each of said linkage sets including a first resilient connecting element connected to said plate body, and a second resilient connecting element connected to said fastening member, said two linkage sets being pivotable toward each other in a direction of said fastening member within a determined angle, with said first and second resilient connecting elements serving as axes, and being capable of bringing said plate body to displace downward toward said fastening member such that said two linkage sets are adapted to engage the two openings, respectively.

2. The fastener for a heat-dissipating device according to claim 1, wherein said fastener is integrally formed.

3. The fastener for a heat-dissipating device according to claim 1, wherein each of said linkage sets further includes an engaging hook disposed at one side of said first and second resilient connecting elements for engaging the respective one of the openings.

4. The fastener for a heat-dissipating device according to claim 1, wherein each of said linkage sets further includes a first link having one end connected to said first resilient connecting element, a second link having one end connected to said second resilient connecting element, and a third resilient connecting element connected to the other end of said first link and to the other end of said second link, said first link and said second link forming an included angle therebetween.

5. The fastener for a heat-dissipating device according to claim 4, wherein said first link has a length longer than that of said second link.

6. The fastener for a heat-dissipating device according to claim 4, wherein said first link and said second link are substantially elongated plates.

7. The fastener for a heat-dissipating device according to claim 4, wherein said first, second and third resilient connecting elements are bent pieces.

8. The fastener for a heat-dissipating device according to claim 1, wherein said fastener defines a first axis and a second axis perpendicular to the first axis, said two linkage sets being pivotable about the first axis toward each other within a determined angle, with said first and second resilient connecting elements serving as axes.

9. The fastener for a heat-dissipating device according to claim 8, wherein said fastening member includes a first coupling plate connected to said second resilient connecting element of one of said linkage sets, and a second coupling plate connected to said second resilient connecting element of the other one of said linkage sets, said fastening member further including a pivot element connecting pivotally said first and second coupling plates, said two linkage sets being pivotable about the second axis within a determined angle such that said two linkage sets are respectively separated from the two openings.

10. The fastener for a heat-dissipating device according to claim 9, wherein said second coupling plate has a substantially inverted L-shape, and includes a first plate body, a second plate body formed at one end of said first plate body, and a fastening hole formed in said second plate body and adapted to engage the other of the positioning members of the securing seat, said pivot element connecting said first coupling plate and said first plate body of said second coupling plate.

11. A heat-dissipating device adapted to dissipate heat from an electronic component on a circuit board, said heat-dissipating device comprising:
   a heat sink;
   a securing seat adapted to be mounted on the circuit board and for mounting of said heat sink, said securing seat including two positioning members disposed respectively on two opposite sides of said securing seat, and two openings, said openings being respectively formed in two opposite sides of one of said positioning members; and
   a fastener including
      a fastening arm for abutting against said heat sink and having a coupling member and a plate body disposed respectively at two opposite ends of said fastening arm, said coupling member being disposed to engage one of said positioning members of said securing seat,
      a fastening member disposed spacedly below said plate body of said fastening arm and disposed to engage the other of said positioning members of said securing seat, and
      two linkage sets, each of which is connected to and is disposed between said plate body and said fastening member, said two linkage sets being disposed respectively on two opposite sides of said plate body and of said fastening member, each of said linkage sets including a first resilient connecting element connected to said plate body, and a second resilient connecting element connected to said fastening member, said two linkage sets being pivotable toward each other in a direction of said fastening member within a determined angle, with said first and second resilient connecting elements serving as axes, and being capable of bringing said plate body to displace downward toward said fastening member such that said two linkage sets respectively engage said two openings in said securing seat.

12. The heat-dissipating device according to claim 11, wherein said fastener is integrally formed.

13. The heat-dissipating device according to claim 11, wherein each of said linkage sets further includes an engaging hook disposed at one side of said first and second resilient connecting elements for engaging the respective one of said openings.

14. The heat-dissipating device according to claim 11, wherein each of said linkage sets further includes a first link having one end connected to said first resilient connecting element, a second link having one end connected to said second resilient connecting element, and a third resilient connecting element connected to the other end of said first link and to the other end of said second link, said first link and said second link forming an included angle therebetween.

15. The heat-dissipating device according to claim 14, wherein said first link has a length longer than that of said second link.

16. The heat-dissipating device according to claim 14, wherein said first link and said second link are substantially elongated plates.

17. The heat-dissipating device according to claim 14, wherein said first, second and third resilient connecting elements are bent pieces.

18. The heat-dissipating device according to claim 11, wherein said fastener defines a first axis and a second axis perpendicular to the first axis, said two linkage sets being pivotable about the first axis toward each other within a determined angle, with said first and second resilient connecting elements serving as axes.

19. The heat-dissipating device according to claim 18, wherein said fastening member further includes a first coupling plate connected to said second resilient connecting element of one of said linkage sets, and a second coupling plate connected to said second resilient connecting element of the other one of said linkage sets, said fastening member further including a pivot element connecting pivotally said first and second coupling plates, said two linkage sets being pivotable about the second axis within a determined angle such that said two linkage sets are respectively separated from said two openings.

20. The heat-dissipating device according to claim 19, wherein said second coupling plate has a substantially inverted L-shape, and includes a first plate body, a second plate body formed at one end of said first plate body, and a fastening hole formed in said second plate body and adapted to engage the other of said positioning members of said securing seat, said pivot element connecting said first coupling plate and said first plate body of said second coupling plate.

* * * * *